United States Patent [19] [11] Patent Number: 4,867,535
Duchenois [45] Date of Patent: Sep. 19, 1989

[54] EXPOSURE ARRANGEMENT FOR THE PRODUCTION OF MASKS

[75] Inventor: Valère Duchenois, Paris, France

[73] Assignee: U.S. Philips Corporation, New York, N.Y.

[21] Appl. No.: 914,425

[22] Filed: Oct. 2, 1986

[30] Foreign Application Priority Data

Dec. 10, 1985 [FR] France .................... 85 18230

[51] Int. Cl.$^4$ .................. G02B 27/00; H04N 9/24
[52] U.S. Cl. ............................ 350/321; 350/1.2; 313/477 R; 358/67; 365/217
[58] Field of Search ............... 350/321.1, 1.1, 500, 350/1.2, 432; 354/1, 410, 465; 365/217, 218; 250/207, 423 R; 313/35, 36, 39, 40, 41, 44, 45, 447, 461, 463, 477 R, 475; 358/64, 65, 67, 74

[56] References Cited

U.S. PATENT DOCUMENTS

| 3,348,896 | 10/1967 | Betensky | 350/1.2 |
|---|---|---|---|
| 3,939,486 | 2/1976 | Tomii | 358/67 |
| 3,967,315 | 6/1976 | Goodman | 358/67 |
| 4,021,820 | 5/1977 | Chase et al. | 354/1 |
| 4,050,778 | 9/1977 | Fleischman | 350/1.2 |
| 4,122,464 | 10/1978 | Morean et al. | 354/1 |
| 4,146,930 | 3/1979 | Honebrink et al. | 365/217 |
| 4,161,039 | 7/1979 | Rössler | 365/218 |
| 4,222,642 | 9/1980 | van Nes et al. | 354/1 |
| 4,529,905 | 7/1985 | Ohkoshi et al. | 313/477 R |
| 4,645,966 | 2/1987 | van Esdonk | 313/477 R |
| 4,678,961 | 7/1987 | Comberg et al. | 313/477 R |
| 4,686,429 | 8/1987 | Fendley | 358/67 |

Primary Examiner—Bruce Y. Arnold
Assistant Examiner—Loha Ben
Attorney, Agent, or Firm—Robert J. Kraus

[57] ABSTRACT

An exposure arrangement for use in a computer-aided design system to produce masks. The arrangement includes a cathode-ray tube which produces an image of the mask on the screen of the tube, and an optical system which projects the image of the mask onto a substrate which is to be exposed. The cathode-ray tube is a high-brightness tube in which the screen is provided with a phosphor which emits in an ultraviolet spectrum and with a cooling circuit for the phosphor. The optical system is designed for use in the ultraviolet spectrum and operates on the ultraviolet image provided by the screen of the high-brightness tube.

3 Claims, 3 Drawing Sheets

EXPOSURE ARRANGEMENT FOR THE PRODUCTION OF MASKS

BACKGROUND OF THE INVENTION

The invention relates to an exposure arrangement for the production of masks, using a computer-aided design system. The arrangement comprises a cathode-ray tube which forms an image of the mask on the screen of the tube, and an optical system which projects the image of the mask onto a substrate which is to be exposed.

Such an arrangement is used in the manufacture of semiconductor devices, in the thin-film and thick-film technique, in production processes in the photographic industry etc.

Such an invention is known from Japanese Patent Application 58.18923 which describes an arrangement consisting of a cathode ray tube having a glass screen which is provided with a phosphor layer in front of which there is positioned an array of optical fibers which catches the light rays issuing from the screen and conducts them in the form of parallel beams. In this way, a substrate located at one end of the array of optical fibers is exposed by light issuing from the screen on which appears the geometrical pattern of the mask produced by means of a computer-aided design system. Apparently, this device is designed to provide the most direct way of utilizing the mask image as it appears on the display console of the computer-aided design system.

However, the arrangement has some disadvantages. First, the magnification of the system can only be equal to 1, the dimensions of the projected image being equal to the dimensions of the image of the screen. Second, as the screen of the tube and the array of optical fibers are made of glass, the spectrum emitted by the photosensitive layer can only be situated in the visible spectrum. Consequently, the final definition of the projected image is limited by the large wavelength of light. Moreover, as the cathode-ray tube used is of a standard type, i.e. it is adapted to the human eyesight, it exhibits a low brightness which is unsuitable for an exposure arrangement and, consequently, leads to long exposure times and an increase in reconstruction errors.

SUMMARY OF THE INVENTION

It is an object of the invention to enable exposure of masks and allow for their magnification and reduction. A further object of the invention is to provide the final projected image with a spatial definition which is sufficiently compatible with the desired applications, while considerably reducing the exposure time.

The invention as described in the opening paragraph is characterized in that the cathode-ray tube is a high-brightness tube the screen of which is provided, first, with a phosphor which emits in the ultraviolet spectrum, and, second, with a cooling circuit for the phosphor, and in that the optical system is designed for use in the ultraviolet spectrum and operates on the ultraviolet image provided by the screen of the high-brightness tube.

The present invention makes use of techniques which are gaining ever more ground and which involve forming masks for patterning an electronic circuit by means of a computer. The present state-of-the-art techniques, which do not make direct use of the image formed on the screen, make use of an intermediate mask formed on a solid carrier. In the present invention this stage is left out.

When the electronic circuit is patterned, an image is formed on the screen of the display console. The image formed is used by the user to align the pattern of the circuit. When direct use is made of the image, there are several drawbacks which have just been analyzed.

When the alignment of the pattern is obtained, a high-brightness tube is electrically connected in parallel, in accordance with the invention, to the display console, making use of the same scanning and synchronization signals. The high-brightness tube, generally has reduced dimensions, for example 90×70 mm. The interior of the screen of the high-brightness tube is coated with a phosphor which emits in the ultraviolet spectrum, for example, between 365 nm and 400 nm.

In comparison with visible light, these shorter wave lengths enable an increased sharpness of the pattern of the final image. The image formed on the screen of the high-brightness tube is transferred by an optical system which is adapted to the ultraviolet spectrum. Dependent upon the object, the image can be magnified, reduced or simply transferred.

In order to facilitate the use of the exposure arrangement for the successive exposure of different masks, reference marks to facilitate the superposition of successive images are provided at the periphery of the screen of the high-brightness tube, outside the effective field. These reference marks consist of small patterns of a phosphor which emits in the visible spectrum. The optical system is adapted to transmit the light emitted in the visible spectrum.

The high-brightness tube and the optical system are jointly fitted in a housing.

In order to carry out the exposure process the image must be fixed for the time of the exposure, with only small variations in position. The exposure time can be substantially reduced by using a high-brightness tube which provides a high light flux.

In accordance with a first preferred alternative embodiment the persistance of the image on the screen is ensured by using a storage tube as a high-brightness tube, which comprises a writing gun, one or more flooding guns, collimation means and a metal grill coated with an insulator which is locally charged with static charges. Thus, it is possible to produce a latent electronic image on the grill by means of a writing gun which is subsequently read using the appropriate flooding guns. Thus, an increased electric power is obtained and, consequently, a more luminous and better contrasting image.

In order to obtain a high brightness without image aberrations, the tube produces an electric power density for the excitation of the phosphor, which may at least be equal to, substantially, 2 Watt/cm$^2$, the flooding gun producing a uniform current density lower than 0.025 A/cm$^2$ in the output plane of the flooding gun.

In accordance with a second alternative embodiment, a high-brightness tube is used which does not have a storage capacity. In this case the image persistence is ensured by recurrently scanning the image.

Taking into account the dissipated electric power, in these two alternative embodiments the high-brightness tube comprises a screen-cooling circuit.

By adapting the UV optical system to specific applications, magnification, reduction or unity scale image transfer becomes possible. Consequently, it is possible to produce masks by exposing photosensitive lacquers deposited on substrates, such as semiconductor arrangements or others.

BRIEF DESCRIPTION OF THE DRAWING

The invention will now be explained in more detail by means of drawing figures which are given as non-limitative examples.

DESCRIPTION OF THE PREFERRED EMBODIMENTS

Figure 1:
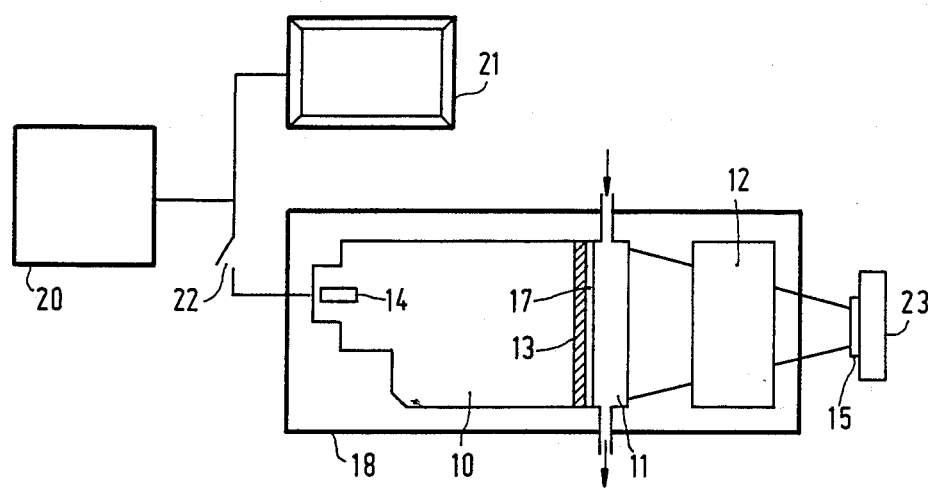
FIG. 1 is a schematic representation of the exposure arrangement in accordance with the invention, which is coupled to a computer-aided design system.

FIG. 1 represents a computer-aided design system which is symbolically represented by a computer 20 and a display console 21 as used in accordance with the prior art.

The operator carries out the alignment of the pattern in the usual way. After this, the exposure arrangement in accordance with the invention is connected in parallel to a display console 21 by means of a contactor 22. The invention comprises a housing 18 in which are arranged a high-brightness tube 10 and an optical system 12 for operating in the ultraviolet spectrum. The high-brightness tube 10 is provided at an output end with a phosphor screen 13 which emits ultraviolet radiation. The phosphor screen 13 is excited by electrons issued from an electron gun 14. The high-brightness tube is designed to operate under high beam currents, which makes it necessary to cool the screen by means of a cooling passage 11 in which a fluid circulates.

The high-brightness tube in accordance with the invention makes it possible to reduce the exposure times, while using UV sensitive lacquers which are commercially available, for example lacquer no. 1350 marketed by SHIPLEY (United States). On/off operation obtained by a bistable drive of the Wehnelt electrode of the tube results in a maximum contrast, which is an advantage of the present invention. Moreover, it is possible to invert the polarity of the video signal, which makes it possible to obtain a mask which represents a positive or a negative image without having to change the type of lacquer. The light beam emanating from the high-brightness tube which is provided with a cooling circuit, penetrates into a UV optical system 12 which produces an image on a substrate 15 which is positioned relative to the optical system by a micromanipulator 23.

The optical system must be adapted to the emission curve of the phosphor. Consequently, for an emission wavelength of 405 nm, it is possible to use the following objective lenses: S. Planar no. 107739 or no 107751 marketed by CARL ZEISS (Federal Republic of Germany).

Figure 2:
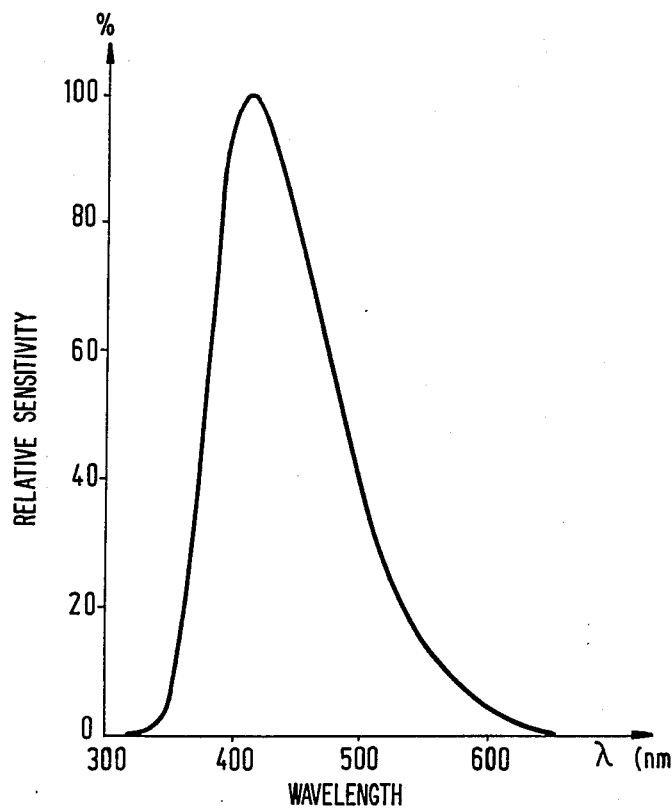
FIG. 2 is a sensitivity curve of a phosphor which emits in the ultraviolet spectrum.

The phosphor may be made of a phosphor P5 as manufactured by RIEDEL DE HAEN (DE), DERBY LUMINESCENT (GB), HS RADIUM (US), whose sensitivity curve is shown in FIG. 2 between 300 nm and 600 nm.

In order to facilitate the process of superpositioning successive masks, reference marks are formed by means of small areas of phosphor which emit in the visible spectrum and replace the basic phosphor. These reference marks are positioned at the pheriphery of the screen. In order to make it visually possible to position successive masks, the optical system is adapted in the visible spectrum so as to transmit a specific wavelength, for example green.

Figure 3:
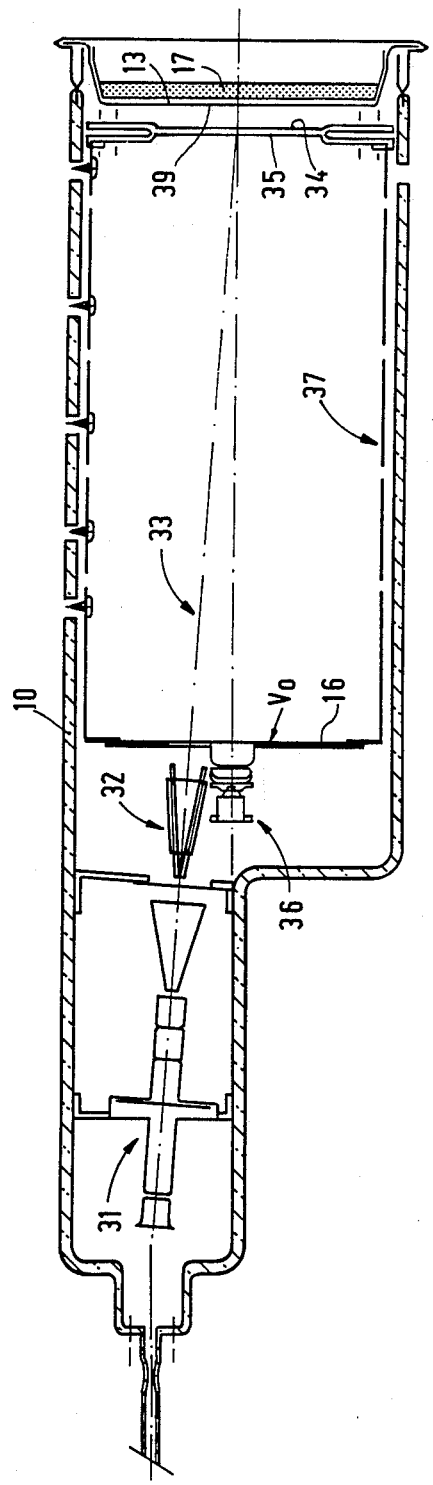
FIG. 3 is a drawing of a high-brightness tube which comprises a storage screen and a phosphor which emits in the ultraviolet spectrum.

In accordance with a preferred modified embodiment of the invention, the high-brightness tube is a storage tube as represented schematically in FIG. 3.

The high-brightness tube 10 comprises a writing gun 31 which produces an electron beam which is focused by screens in the gun and deflected by plates 32 or coils to form a writing electron beam 33. The beam impinges on a storage grid 34 which has a small pitch of approximately 60 microns and a transparency of approximately 50%. At the locations of the storage grid 34 the diameter of the writing electron beam 33 is about 30 microns, the electrons having an energy on the order of 1500 eV. At the side where the beam 33 impinges on the grid, the grid is coated with a thin oxide layer, for example 4 to 5 microns of magnesium oxide which has the property of emitting secondary electrons. This results in the fixation of static charges on the storage grid, from which the storage grid derives its name. The emitted secondary electrons are collected by a collector grid 35 which is located immediately in front of the storage grid, between the grid and the plates 32. This collector grid 35 has a large pitch (approximately 600 microns) and a high degree of transparency (approximately 80%). This grid also serves to define the electric field of the space between the collector grid and the storage grid and the display screen in order to define the dynamic characteristics of picture brightness.

After writing, the next stage in the operation of a storage tube consists of reading the static charges present on the storage grid. This is carried out by means of one or more flooding guns 36 which operate at far higher currents than those produced by the gun 31. The reading electron beam is very homogeneous and well collimated by collimation means 37, and the energy of the electrons is low, approximately 5 to 6 eV. A current of 10 mA produced by the flooding gun, a voltage between the screen and the storage grid of 30 kV and a transparency of the storage grid of 50%, results in a power dissipation of 150 W at the screen.

Figure 4:
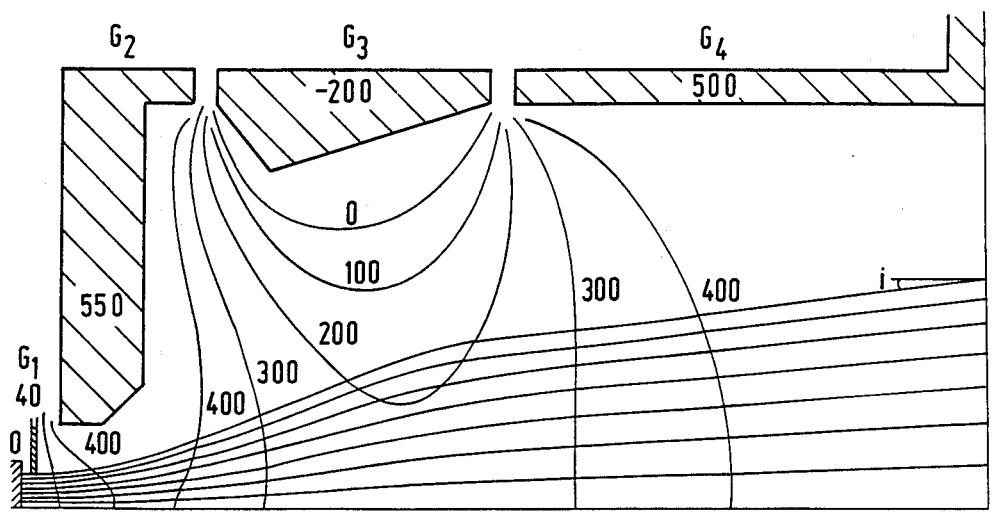
FIG. 4 is a representation of the electron trajectories of a flooding gun.

FIG. 4 represents the electron trajectories and the distribution of the potential of a flooding gun which can be used in a high brightness storage tube. Taking into account the symmetry of the gun, only a sectional view of half the gun is shown. By way of example, a current of 20 mA raises the four electrodes G1, G2, G3, G4, to the following potentials relative to the cathode:

$VG_1 = 40$ Volts; $VG_2 = 550$ Volts;

$VG_3 = -200$ Volts; $VG_4 = 500$ Volts;

The layout of the "cathode-electrode G1-electrode G2" assembly and the choice of the relative potentials $VG_2/VG_1$ define the uniform emission conditions which are comparable to those of a planar diode, because they define a configuration of potentials such that the substantially median plane of the thin electrode G1 has a uniform potential $VG_1$. The potential $VG_1$ and the aperture of the electrode G2 define a deflecting lens for the beam. The electrode G3 which is associated with the two electrodes G2 and G4 forms a converging lens with these electrodes which reduces the opening angle of the beam, the diameter of which has previously been enlarged by the preceding deflecting lens. Thus, the angle i in the output plane of the gun is reduced to below, approximately, 8°. Therefore, the potential $VG_3$ of the electrode G3 is negative relative to the cathode which is at a potential $VK=0$. If the tube is to be used with luminous fluxes whose performance is below the maximum, it is possible to reduce the negative potential $VG_3$ and even to make it equal to the potential VK of the cathode.

Advantageously, the potential VK is lower than the potential $VG_1$ of the electrode G1 which in turn is lower than the potential $VG_2$ of the grid G2.

Figure 5:
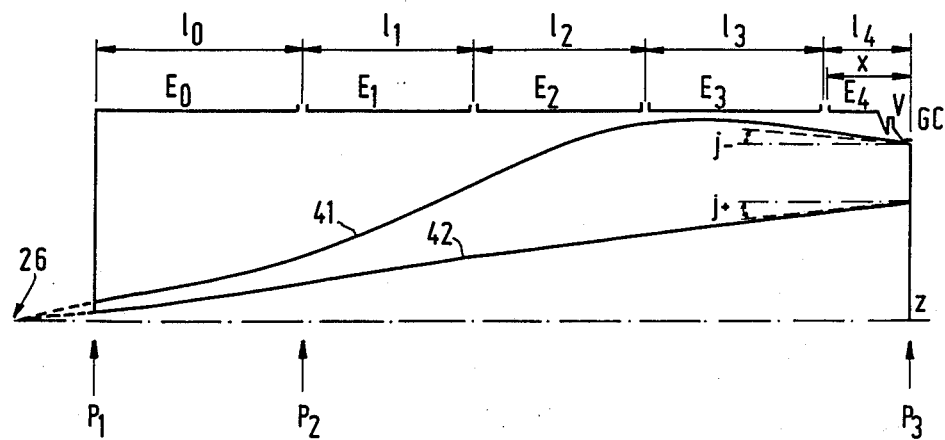
FIG. 5 is a representation of the electron trajectories of a collimation means.

FIG. 5 is a simplified representation of the electron paths of the collimation means. The input plane of the collimation means substantially coincides with the output plane P1 of the flooding gun. In the plane, the electron paths seem to issue from a virtual image point source 26 which characterizes the flooding gun. On the inside of the collimation means two characteristic paths 41, 42 are shown. The path 42 has a rising gradient and an inclination $j_+$ in the output plane P3, which characterizes a curve which is situated below the normal at the point of impact. The path 41 has a rising gradient followed by a descending gradient. The path 41 has an inclination $j_{31}$ which characterizes a path which is situated below the normal at the point of impact. This path 41 shows the influence of the potentials applied to the electrodes of the collimation means which collimate the electron paths on the output plane.

Electron paths which are intercepted by the electrodes E0, E1, E2, E3 or E4 which form the collimation means, produce currents in these electrodes which are lost for the final image. In order to preclude this loss of current in the electrodes and ensure that the inclinations $j_+$ and $j_-$ have a value lower than approximately 2°, the collimation means are produced as described below.

The first electrode E0 consists of a cylindrical ring having a radius R0=71.5 mm and a length L0 which is substantially equal to R0 in order to shield the output apertures of the guns opposite the fields of the collimation means. In this example, it has a potential of approximately 500 Volts because it represents the output potential of the flooding gun.

The electrodes E1, E2, E3 are substantially identical. They each consist of a cylindrical ring having a radius R1=R2=R3=71.5 mm. They each are of about the same length.

The electrode E4 is cup-shaped and has a radius R4=R3, on which electrode the collector grid is mounted by means of a rectangular frame. The effective half diagonal on which the collimation means must operate is on the order of 60 mm. Preferably, the potential at the electrode E4 is identical to the potential VGC at the collector grid 35. The depth x of the cup which forms the final electrode E4 is 27 mm, such that x/R is substantially equal to 0.38 which, according to the various applications, provides the collimation lens with its properties in a large field of potential variations.

The potentials at the electrodes E0, E1 are superior to the potential VGC, which defines an optical system which is totally decelerating. Consequently, the electrons issuing from the flooding gun and reflected by the storage grid, while again traversing the collector grid in proportion to the transparency, will not be finally rejected there. The bulk are collected by the electrodes E0 and E1, which avoids heating of the collector grid.

In the optical system, the potentials V2 and V3 at the electrodes E2 and E3 may be inferior to VGC.

After the latent image has been inscribed on the insulation of the storage grid by means of a writing gun, it must be read by a flooding gun. The electrons which traverse the collector grid to which a potential of, for example, VGC=200 Volts is applied, penetrate the field of the storage grid. The latter grid has its metal support biased at a value of VGS which corresponds to the cut-off of the flooding beam in the absence of the inscribed image (initial state). Dependent upon the layout of the grid and, of course, the field of the screen, VGS is typically $-5$ to $-8$ Volts relative to the cathode. On the other hand, the potential VGM of its insulating layer is, for example, $-2$ Volts because of the positive storage charge on the insulation after the writing operation (the secondary emission coefficient is superior to 1). The potential of the screen being, for example, 25 KV, the electrons must in order to reach the screen traverse the storage grid in which each element of the grid, provided with an insulation, will form an electronic microlens. The aperture of the microlens which is controlled by VGM and the inclination of the electron paths on the collector grid govern the passage of the electrons via these microlenses. Thus, a coefficient of transmission T1 of the storage grid is defined. Typically, the transmission is 60% when the microlenses are completely open.

The erasing system is used for recurring images. A fixed image is suitably erased after exposure of the photo-sensitive lacquer. In this case the bias of the support of the storage grid is at a potential VGS=0 Volt while blocking the inscription gun. Thus, the charges are neutralized, the insulation obtains the potential of the cathode and the target is ready for a new writing operation. Erasing using a specific flooding gun is also possible.

In FIG. 3, the electron beam emanating from the flooding gun impinges on a thin aluminum layer 39 to which a very high voltage is applied and which is positioned on the phosphor 13 which emits in the ultraviolet spectrum deposited on the screen 17. The dimensions of the spot on the phosphor are of the order of 60 microns. The deflection plates 32 move in step with the display console. In order to obtain both a short exposure time and a bright contrast, the grid voltage (wehnelt) is modulated in a bistable way. In this way, using a commonly used lacquer such as no. 1350 from SHIPLEY, an exposure time of the order of 10 seconds is obtained. By thus reducing the exposure time, the restitution imprecisions which are generally caused by slight vibrations of the common exposure systems are reduced.

In order to improve the high-brightness performance and the brightness homogeneity of the tube, it is possible to either use a larger cathode which necessitates a flooding gun electron optical system of the same type as described above but of adapted dimensions, or various flooding guns.

In accordance with a second modified embodiment, the high-brightness tube does not have a storage function, consequently, it does not have flooding guns, storage grids and collector grids. Thus, less electric power is dissipated, on the order of 60 Watt. In order to obtain a stable image on the screen for the duration of the exposure time, recurrent scanning is necessary. Using the same lacquer as described above, the exposure time is between 30 seconds and 1 minute.

The exposure arrangement which is described above by means of two modified embodiments, makes it possible to skip certain stages in the production of circuits. In the case of thin-film applications or semiconductor substrates, it is possible to directly expose the substrate coated with the photosensitive lacquer. In the case of thick-film applications it is possible to expose the silk-screen printing screens which are used to deposit the ink.

What is claimed is:

1. An exposure arrangement for producing a mask for exposing a substrate, said arrangement comprising:
   a. a high-brightness cathode-ray tube having a luminescent screen consisting essentially of a luminescent material for emitting radiation in the ultraviolet spectrum when excited by an electron beam;
   b. an electron gun for producing an electron beam directed at said screen;
   c. deflection means for deflecting the electron beam across the screen to form an ultraviolet image of the mask;
   d. cooling means thermally coupled to the screen for transferring heat away from said screen; and
   e. an optical system disposed adjacent the screen for projecting onto the substrate a predetermined-size image of the ultraviolet mask image produced by the screen.

2. An exposure arrangement as in claim 1 where the cathode-ray tube comprises a storage tube for storing a latent image of the mask.

3. An exposure arrangement as in claim 1 or 2 where the screen includes a pattern of luminescent material of a type which luminesces in the visible spectrum for producing visible reference marks.

* * * * *